US011211108B2

(12) United States Patent
Van Houdt

(10) Patent No.: US 11,211,108 B2
(45) Date of Patent: Dec. 28, 2021

(54) FERROELECTRIC MEMORY DEVICE

(71) Applicant: IMEC vzw, Leuven (BE)

(72) Inventor: Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/226,356

(22) Filed: Dec. 19, 2018

(65) Prior Publication Data
US 2019/0206474 A1    Jul. 4, 2019

(30) Foreign Application Priority Data

Dec. 29, 2017    (EP) .................................... 17211151

(51) Int. Cl.
*G11C 11/22*    (2006.01)
*H01L 23/528*    (2006.01)
*H01L 27/11507*    (2017.01)

(52) U.S. Cl.
CPC ............ *G11C 11/221* (2013.01); *G11C 11/22* (2013.01); *G11C 11/2255* (2013.01); *G11C 11/2257* (2013.01); *G11C 11/2273* (2013.01); *G11C 11/2275* (2013.01); *H01L 23/528* (2013.01); *H01L 27/11507* (2013.01)

(58) Field of Classification Search
CPC ............ G11C 11/2257; G11C 11/2255; G11C 11/2275; G11C 11/2273; G11C 11/221; G11C 11/22; H01L 27/11507; H01L 23/528
See application file for complete search history.

(56) References Cited

U.S. PATENT DOCUMENTS

| | | | | |
|---|---|---|---|---|
| 5,414,653 A | * | 5/1995 | Onishi | ..................... G11C 11/22 257/295 |
| 5,753,946 A | * | 5/1998 | Naiki | ..................... G11C 11/22 257/295 |
| 5,768,176 A | * | 6/1998 | Katoh | ..................... G11C 11/22 365/145 |
| 8,441,841 B2 | * | 5/2013 | Nagatsuka | ............ G11C 11/413 365/149 |

(Continued)

FOREIGN PATENT DOCUMENTS

CN    101908371 A    12/2010

OTHER PUBLICATIONS

Search Report received in European Application No. EP 17211151.0 dated May 9, 2018; 11 pages.

*Primary Examiner* — Khamdan N. Alrobaie
(74) *Attorney, Agent, or Firm* — Knobbe, Martens, Olson & Bear, LLP

(57) ABSTRACT

The disclosed technology generally relates to a memory device, and more particularly to a ferroelectric memory device and a method of operating the memory device. According to one aspect, a memory device comprises a bit cell. The bit cell comprises a write transistor, a read transistor and a ferroelectric capacitor. A write word line is connected to a gate terminal of the write transistor. A write bit line is connected to a first terminal of the write transistor. A read bit line connected to a terminal of the read transistor. A first control line is connected to a first electrode of the ferroelectric capacitor. A second terminal of the write transistor is connected to the gate terminal of the read transistor, and a second electrode of the ferroelectric capacitor is connected to the second terminal.

18 Claims, 3 Drawing Sheets

(56) References Cited

U.S. PATENT DOCUMENTS

| | | | | |
|---|---|---|---|---|
| 10,388,364 B2* | 8/2019 | Ishizu | ............... | G11C 11/4099 |
| 2016/0343452 A1* | 11/2016 | Ikeda | ............... | G11C 27/024 |
| 2018/0102365 A1* | 4/2018 | Van Houdt | ......... | H01L 21/8254 |
| 2019/0138893 A1* | 5/2019 | Sharma | ............... | G06N 3/0635 |

* cited by examiner

|  | WLw1 | BLw1 | BLr1 | SL1/GND | CL1 |
|---|---|---|---|---|---|
| Write "1" | Vcc | Vcc | 0 | 0 | 0 |
| Erase | Vcc | 0 | 0 | 0 | Vcc |
| Read | 0 | 0 | Vcc/SA | 0 | 0 |
| Read inhibit | 0 | 0 | Vcc/SA | 0 | -Vcc/2 |

*Fig. 2*

|  | WLw1 | BLw1 | BLr1 | SL1/GND | CL1 |
|---|---|---|---|---|---|
| Write "1" | Vcc | Vcc | 0 | 0 | 0 |
| Erase | Vcc | 0 | 0 | 0 | Vcc |
| Read | 0 | 0 | Vcc/SA | 0 | Vcc/2 |
| Read inhibit | 0 | 0 | Vcc/SA | 0 | 0 |

*Fig. 3*

FERROELECTRIC MEMORY DEVICE

CROSS-REFERENCE TO RELATED APPLICATIONS

This application claims foreign priority to European Patent Application No. EP 17211151.0, filed Dec. 29, 2017, the content of which is incorporated by reference herein in its entirety.

BACKGROUND

Field

The disclosed technology generally relates to a memory device, and more particularly to a ferroelectric memory device and a method of operating the memory device.

Description of the Related Technology

Ever-increasing data storage demands is a driver for the continuing development of memory devices with greater circuit densities and reduced power consumption. A considerable amount of the effort in the continuing development of memory devices is directed to chip-based non-volatile memory (NVM). One type of non-volatile memory technology is ferroelectric memory such as ferroelectric random access memory (FeRAM). A bit cell of a ferroelectric memory generally includes a transistor and a ferroelectric capacitor (which arrangement is sometimes referred to as a 1T1C bit cell). In these implementations, a gate terminal of the transistor is connected to a wordline. A first terminal of the transistor is connected to a bit line and a second terminal of the transistor is connected to the ferroelectric capacitor.

In a ferroelectric capacitor the electrodes are separated by a layer of a ferroelectric material. A polarization of the ferroelectric layer is set to either one of two states with opposite orientation of polarization. The state of polarization is nonvolatile, or substantially remains even when the memory device is turned off or in the absence of an external electrical field applied to the ferroelectric material. The polarization state may be switched between the two states by applying an electrical field of sufficient strength in a direction opposite to the present polarization state. Hence, two different polarization states (or correspondingly a positive and a negative voltage) may be stored in the capacitor. The different states/voltages may accordingly be associated with a logic "1" and a logic "0".

However, in some conventional ferroelectric memory devices, the read-out operation may be destructive to the polarization state of the ferroelectric material. In these memory devices, following a read-out of a cell, data may need to be re-written to read bit cell. Thus, there is a need for ferroelectric memory devices that are configured such that the read-out operation is less destructive to the polarization state of the ferroelectric material.

SUMMARY OF CERTAIN INVENTIVE ASPECTS

An objective of the disclosed technology is to provide a memory device with a ferroelectric capacitor configured such that the read-out operation is less destructive or non-destructive to the polarization state of the ferroelectric material during read-out operations. Further and alternative objectives may be understood from the following.

According to a first aspect of the disclosed technology a memory device comprises: a bit cell comprising a write transistor, a read transistor and a ferroelectric capacitor; a write word line connected to a gate terminal of the write transistor; a write bit line connected to a first terminal of the write transistor; a read bit line connected to a terminal of the read transistor; and a first control line connected to a first electrode of the ferroelectric capacitor. A second terminal of the write transistor is connected to the gate terminal of the read transistor. A second electrode of the ferroelectric capacitor is connected to the second terminal of the write transistor and to the gate terminal of the read transistor.

The disclosed memory device includes a bit cell which may be denoted as a 2T1C-bit cell (2 transistors and one capacitor). The memory device is based on the insight that by arranging the ferroelectric capacitor away from the direct read-out path, and instead providing a dedicated read out transistor having a gate terminal connected to the ferroelectric capacitor, the ferroelectric capacitor may retain a stored polarization during read-out of the bit cell and be less susceptible to read disturbance. The memory device may be suitable for non-volatile memory (NVM) applications.

The ferroelectric capacitor and the write and read transistors, which can both be transistors of the same type, e.g., n-type field effect transistors (FETs), may all be realized with silicon-based technologies. Silicon-based transistors may further facilitate achieving good writing performance.

As used herein, a ferroelectric capacitor refers to a capacitor including a first electrode, a second electrode and a ferroelectric layer arranged between the first electrode and the second electrode. A polarization state of the ferroelectric layer may be set to either one of a first state and a second state (i.e., set to the first state or the second state). The first polarization state may be set by applying an electrical field with a field vector oriented in a direction from the first electrode towards the second electrode. The second polarization state may be set by applying an electrical field with a field vector oriented in a direction from the second electrode towards the first electrode. The first and the second polarization states may be referred to as opposite polarization states of the ferroelectric capacitor.

In the following, the ferroelectric capacitor may, when storing the first polarization state, be described as storing a (predetermined) write data voltage. For example, the stored polarization results in a potential difference between the first and the second electrodes of the ferroelectric capacitor which corresponds to a write data voltage. The write data voltage may be a positive voltage. Conversely, the voltage stored by the ferroelectric capacitor may, when storing the second polarization state, be described as storing a (predetermined) erase data voltage. For example, the stored polarization results in a potential difference between the first and the second electrodes of the ferroelectric capacitor which corresponds to an erase data voltage. The erase data voltage may be opposite to the write data voltage, e.g., a negative voltage.

The ferroelectric capacitor may be a dedicated capacitor including dedicated first and second electrodes. The ferroelectric capacitor may, however, also be formed by a parasitic capacitive coupling through a ferroelectric layer. For instance, the ferroelectric capacitor may be formed by a capacitive coupling through a ferroelectric layer arranged between a conductive line local to the bit cell, and another conductive element of the memory device such as a portion of the first control line.

The terminal of the read transistor may be a first terminal wherein a second terminal of the read transistor may be connected to a sense line of the memory device. The memory device may include a sense amplifier connected to the sense line. A first terminal may be connected to one of a source or a drain of the read transistor, and a second terminal may be connected to the other of the source or the drain of the read transistor.

Alternatively, the terminal of the read transistor may be a first terminal wherein a second terminal of the read transistor may be connected to a voltage reference, e.g. a (predetermined) low-level voltage reference such as a zero voltage.

As used herein, a zero voltage is equivalent to a ground voltage. Unless stated otherwise, any reference to a low-level voltage reference may refer to a zero voltage and vice versa.

The memory device may further comprise driver circuitry configured to write data to the bit cell by switching the write transistor to an on state by applying a write control voltage to the write transistor via the write word line, and setting a polarization of a ferroelectric layer of the ferroelectric capacitor to a first polarization state by applying a first voltage to the first electrode of the ferroelectric capacitor via the first control line and a second voltage to the second electrode of the ferroelectric capacitor via the write bit line, wherein the second voltage is greater than the first voltage.

Thereby, a first polarization state (corresponding to a positive write data voltage) may be stored in the capacitor.

By applying the second voltage greater than the first voltage, an electric field may be generated between the first electrode and the second electrode which sets the ferroelectric layer to the first polarization state. Here it is assumed that a difference between the second voltage and the first voltage meets or exceeds a minimum voltage difference required to set the polarization of the ferroelectric layer to the first state. The setting of the polarization of the ferroelectric layer to the first state may include switching the ferroelectric layer from the second state to the first state.

Following storing of the write data voltage, the driver circuitry may switch the write transistor to an off state. Moreover, a low-level voltage reference may be applied to the first control line.

The driver circuitry may be further configured to erase data from the bit cell by switching the write transistor to an on state by applying an erase control voltage to the write transistor via the write word line, and setting the polarization of the ferroelectric layer to a second polarization state by applying a third voltage to the first electrode of the ferroelectric capacitor via the first control line and a fourth voltage to the second electrode of the ferroelectric capacitor via the write bit line, wherein the third voltage is greater than the fourth voltage.

Thereby, a second polarization state (corresponding to a negative erase data voltage) may be stored in the capacitor.

By applying the third voltage greater than the fourth voltage, an electric field may be generated between the second electrode and the first electrode which sets the ferroelectric layer to the second polarization state. Here, it is assumed that a difference between the third voltage and the fourth voltage meets or exceeds a minimum voltage difference required to set the polarization of the ferroelectric layer to the second state (either by being switched from the first polarization state to the second polarization state or by remaining in the second polarization state if no data has previously been written to the bit cell).

Following storing of the erase data voltage, the driver circuitry may switch the write transistor to an off state. Moreover, a low-level voltage reference may be applied to the first control line.

Preferably, the polarization of the ferroelectric layer when set to the second polarization state is such that a voltage at the gate terminal of the read transistor, in response to a low-level voltage reference being applied to the first control line, is smaller than a threshold voltage of the read transistor. In other words, the erase data voltage stored by ferroelectric capacitor is such that the voltage at the gate terminal, in response to the low-level voltage reference being applied to the first control line, is smaller than a threshold voltage of the read transistor.

The erasing operation may be performed prior to writing data to the bit cell in order to initialize the bit cell prior to writing.

The driver circuitry may be configured to read data from the bit cell by: applying a read bit voltage to the terminal of the read transistor via the read bit line, and applying a fifth voltage to the first electrode of the ferroelectric capacitor via the first control line. The fifth voltage is such that: on a condition that the ferroelectric layer is in the first polarization state when the fifth voltage is applied to the first electrode, the read transistor is switched to an on state, while on a condition that the ferroelectric layer is in the second polarization state when the fifth voltage is applied to the first electrode, the read transistor remains in an off state.

As the read transistor is switched to the on state when the first polarization state is stored in the ferroelectric capacitor but not when the second polarization state is stored in the ferroelectric capacitor, the state of the bit cell or more specifically of the ferroelectric capacitor may be read out from the bit cell, non-destructively. Closing of the read transistor may result in a current being conducted through the read transistor, which current may be sensed either on the bit line or (if the second terminal is connected to a sense line) on the sense line by a sense amplifier.

The first polarization state may be such that a voltage at the gate terminal of the read transistor, in response to a low-level voltage reference being applied to the first control line, meets or exceeds a threshold voltage of the read transistor. The second polarization state may be such that a voltage at the gate terminal of the read transistor, in response to a low-level voltage reference being applied to the first control line, is smaller than a threshold voltage of the read transistor. Hence, the bit cell may be read out by applying a zero voltage to the first control line.

The memory device may further comprise an additional bit cell comprising: a write transistor; a read transistor having a terminal connected to the first read bit line; and a ferroelectric capacitor having a first electrode connected to a second control line and a second electrode connected to a gate terminal of the read transistor. The fifth voltage applied by the driver circuitry to the first control line during reading data from the bit cell is a zero voltage. The driver circuitry is configured to, during reading data from the bit cell, inhibit reading from the additional bit cell by applying a sixth voltage to the first electrode of the ferroelectric capacitor via the second control line. The sixth voltage is a negative voltage (e.g., smaller than the fifth voltage) such that, when the fifth voltage is applied to the first electrode, the read transistor remains in an off state regardless of the first polarization state or the second polarization state being stored in the ferroelectric capacitor.

During read out of the bit cell, read out from bit cells along the same bit line (such as the additional bit cell) may be inhibited by applying the fifth voltage to the second control line. Hence the voltage at the gate terminal of the read transistor may be pulled down below the threshold voltage of the read transistor even if the write data voltage has been stored in the additional bit cell.

The read transistor of the additional bit cell may have a threshold voltage matching the threshold voltage of the read transistor of the bit cell.

Alternatively, both the first and the second polarization states may be such that a voltage at the gate terminal of the read transistor, in response to a low-level voltage reference being applied to the first control line, is less than a threshold voltage of the read transistor. In other words, write data voltage and the erase data voltage may be less than a threshold voltage of the read transistor.

The memory device may further comprise an additional bit cell comprising: a write transistor, a read transistor having a terminal connected to the first read bit line, and a ferroelectric capacitor having a first electrode connected to a second control line and a second electrode connected to a gate terminal of the read transistor. The fifth voltage applied by the driver circuitry to the first control line during reading data from the bit cell is a positive voltage. The driver circuitry is configured to, during reading data from the bit cell, inhibit reading from the additional bit cell by: applying a sixth voltage to the first electrode of the ferroelectric capacitor via the second control line, wherein the sixth voltage is a positive low-level voltage or a zero voltage.

Similar to the above disclosed read-inhibit operation, read out from bit cells along the same bit line may be inhibited by applying the sixth voltage to the second control line. However, as in this case both the write data voltage and the erase data voltage are less than the threshold voltage of the read transistor, read-inhibit may be achieved without applying a negative voltage to the second control line. Hence the voltage at the gate terminal of the read transistor may be maintained below the threshold voltage of the read transistor even if the write data voltage has been stored in the additional bit cell.

The read transistor of the additional bit cell may have a threshold voltage matching the threshold voltage of the read transistor of the bit cell.

Advantageously, the sixth voltage may be a zero voltage.

The fifth voltage applied to the first electrode of the ferroelectric capacitor of the bit cell to be read-out may be a positive non-zero voltage such that: on a condition that the write data voltage is stored in the ferroelectric capacitor when the fifth voltage is applied to the first electrode, the read transistor is switched to an on state, and on a condition that the erase data voltage is stored in the ferroelectric capacitor when the fifth voltage is applied to the first electrode, the read transistor remains in an off state.

In the method and the variations thereof described above, the first voltage may be a predetermined high level voltage and the second voltage may be a predetermined low level voltage, preferably a zero voltage (i.e. a ground voltage).

The third voltage may be a predetermined low level voltage, preferably a zero voltage, and the fourth voltage may be a predetermined high level voltage.

According to a second aspect of the disclosed technology a field programmable gate array (FPGA) device comprises: an interconnect circuitry including a system of signal routing lines and a plurality of programmable interconnect points, and a memory device according to any of the above embodiments, wherein the read transistor of the bit cell is arranged at one of the programmable interconnect points and is configured to selectively interconnect a pair of the signal routing lines.

Hence, the bit cell may be associated with an interconnect point of the FPGA and used for control the signal routing within the FPGA. By storing the write data voltage in the bit cell, the pair of signal routing lines may be interconnected. By storing the erase data voltage in the bit cell, the pair of signal routing lines may be disconnected.

FPGAs typically employ static random access memory (SRAM) memory devices to provide the programmable interconnections. However, SRAMs are comparably large structures which may hinder down-scaling of the FPGA.

The disclosed memory device may, however, be formed with comparably small area requirements. The further advantages discussed in connection with the first aspect applies correspondingly to the present aspect.

According to a third aspect a method of operating a memory device comprises providing a memory device. The memory device comprises: a bit cell comprising a write transistor, a read transistor and a ferroelectric capacitor; a write word line connected to a gate terminal of the write transistor; a write bit line connected to a first terminal of the write transistor; a read bit line connected to a terminal of the read transistor; and a first control line connected to a first electrode of the ferroelectric capacitor. A second terminal of the write transistor is connected to the gate terminal of the read transistor, and a second electrode of the ferroelectric capacitor is connected to the second terminal of the write transistor and to the gate terminal of the read transistor. The method comprises: setting a polarization of a ferroelectric layer of the ferroelectric capacitor to a first polarization state by applying a write control voltage to the write transistor via the write word line, and storing a write data voltage in the ferroelectric capacitor by applying a first voltage to the first electrode of the ferroelectric capacitor via the first control line and a second voltage to the second electrode of the ferroelectric capacitor via the write bit line, wherein the second voltage is greater than the first voltage.

As discussed above, this enables writing of data to the bit cell.

The method may further comprise: switching the write transistor to an on state by applying an erase control voltage to the write transistor via the write word line, and setting the polarization of the ferroelectric layer to a second polarization state by applying a third voltage to the first electrode of the ferroelectric capacitor via the first control line and a fourth voltage to the second electrode of the ferroelectric capacitor via the write bit line, wherein the third voltage is greater than the fourth voltage and wherein the erase data voltage is smaller than the write data voltage.

As discussed above, this enables erasing of data to the bit cell, or initialization of the bit cell prior to writing.

The method may further comprise: applying a read bit voltage to the terminal of the read transistor via the read bit line, and applying a fifth voltage to the first electrode of the ferroelectric capacitor via the first control line. The fifth voltage is such that: on a condition that the ferroelectric layer is in the first polarization state when the fifth voltage is applied to the first electrode, the read transistor is switched to an on state, and on a condition that the ferroelectric layer is in the second polarization state when the fifth voltage is applied to the first electrode, the read transistor remains in an off state.

As discussed above, this enables non-destructive reading of data from the bit cell.

The first polarization state may be such that a voltage at the gate terminal of the read transistor, in response to a low-level voltage reference being applied to the first control line, meets or exceeds a threshold voltage of the read transistor. The second polarization state may be such that a voltage at the gate terminal of the read transistor, in response to a low-level voltage reference being applied to the first control line, is smaller than a threshold voltage of the read transistor. The method may further comprise, during reading data from the bit cell, applying the fifth voltage to the first control line as a zero voltage, and inhibiting reading from the additional bit cell. Inhibiting includes applying a sixth voltage to the first electrode of the ferroelectric capacitor via the second control line, wherein the sixth voltage is a negative voltage such that, when the fifth voltage is applied to the first electrode, the read transistor remains in an off state regardless of the first polarization state or the second polarization state being stored in the ferroelectric capacitor.

As discussed above, this enables read inhibit of bit cells along a same bit line.

Alternatively, both the first and the second polarization states may be such that, a voltage at the gate terminal of the read transistor, in response to a low-level voltage reference being applied to the first control line, is less than a threshold voltage of the read transistor. The method may further include, during reading data from the bit cell applying the fifth voltage to the first control line as a positive voltage, inhibiting reading from the additional bit cell by applying a sixth voltage to the first electrode of the ferroelectric capacitor via the second control line, wherein the sixth voltage is a positive voltage smaller than the fifth voltage, such as a positive low-level voltage, preferably a zero voltage.

As discussed above, this enables read inhibit of bit cells along a same bit line without requiring a negative voltage on the second control line.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

FIGS. 2 and 3 are tables exemplifying voltages applied during operation of the memory device illustrated in FIG. 1, according to embodiments.

DETAILED DESCRIPTION OF CERTAIN ILLUSTRATIVE EMBODIMENTS

Figure 1:
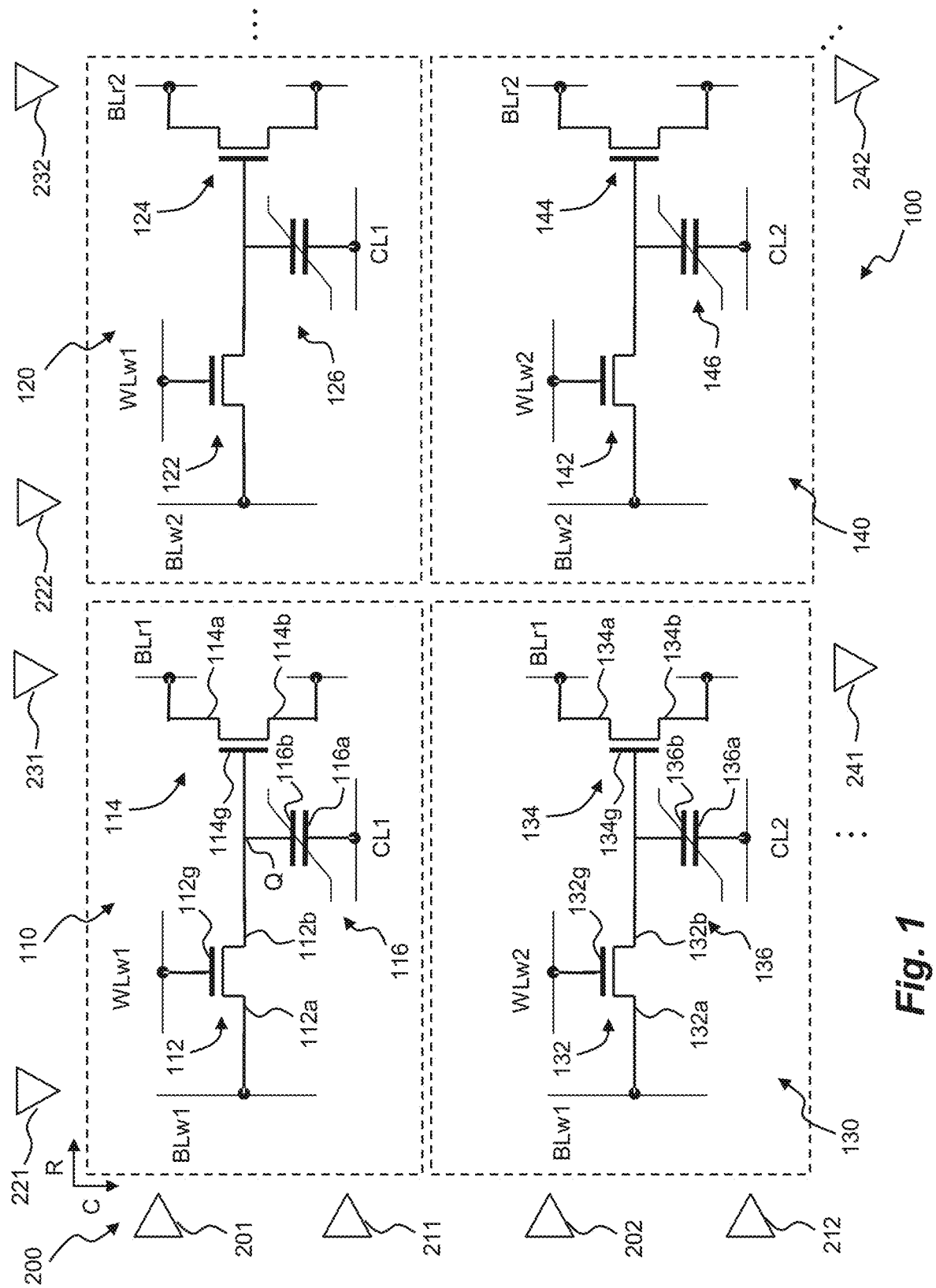
FIG. 1 is a schematic circuit diagram layout of a memory device, according to embodiments.

FIG. 1 illustrates a memory device 100 comprising a plurality of bit cells. In FIG. 1, only four bit cells 110, 120, 130, 140 are shown for clarity. However, the memory device includes a plurality of bit cells arranged in columns and rows. A row direction "R" and a column direction "C" extend as indicated in FIG. 1.

The memory device comprises a bit cell 110. The bit cell 110 comprises a write transistor 112, a read transistor 114 and a ferroelectric capacitor 116.

The write transistor 112 and the read transistor 114 may both be the same type of FETs (field effect transistors), e.g., n-type FETs, such as n-type MOSFETS. The write transistor 112 includes three terminals: a gate terminal 112g, a first terminal 112a and a second terminal 112b. The first and the second terminals 112a, 112b may also be referred to as source/drain terminals of the write transistor 112.

The read transistor 114 includes three terminals: a gate terminal 114g, a first terminal 114a and a second terminal 114b. The first and the second terminals 114a, 114b may also be referred to as source/drain terminals of the write transistor 114.

The ferroelectric capacitor 116 includes a first electrode 116a and a second electrode 116b. The first electrode 116a and the second electrode 116b are separated by a ferroelectric layer. Any ferroelectric layer suitable for a ferroelectric capacitor may be used. The ferroelectric layer may be or include a layer of hafnium oxide ($HfO_2$), zirconium oxide ($ZrO_2$), hafnium titanium oxide ($Hf_xTi_{1-x}O_2$), hafnium zirconium oxide ($Hf_xZr_{1-x}O_2$) or a combination thereof. The ferroelectric layer may be doped for stronger ferroelectric characteristics. Other possible materials include (Pb,Zr)$TiO_3$ and $SrBi_2Ta_2O_9$. Regardless of the material choice, the ferroelectric capacitance of the ferroelectric layer may advantageously correspond to or be about the same or exceed the gate capacitance of the read transistor 114.

Within the bit cell 110, the second terminal 112b of the write transistor 112 is connected to the gate terminal 114g of the read transistor 114. The second electrode 116b of the ferroelectric capacitor 116 is connected to the second terminal 112b of the write transistor 112 and to the gate terminal 114g of the read transistor 114. The second terminal 112b, the second electrode 116b and the gate terminal 114g are galvanically interconnected, e.g., without any intervening capacitive elements or the like. Put differently, the bit cell 110 includes an internal node Q to which each one of the second terminal 112b, the second electrode 116b and the gate terminal 114g is directly connected.

The memory device 100 further includes a set of signal lines. The memory device 100 includes a first write word line WLw1, a first write bit line BLw1, a first read bit line BLr1, and a first control line CL1. The first write word line WLw1 is connected to the gate terminal 112g of the write transistor 112. The first write bit line BLw1 is connected to the first terminal 112a of the write transistor 112. The first read bit line BLr1 is connected to the terminal 114a of the read transistor 114. The first control line CL1 is connected to the first electrode 116a of the ferroelectric capacitor 116. The memory device 100 may further include a sense line or a ground line to which the second terminal 114b of the read transistor 114 is connected.

Each of the additional bit cells 120, 130, 140 has a corresponding configuration as the first bit cell 110 and, accordingly, each of the additional bit cells includes a respective write transistor 122/132/142, a respective read transistor 124/134/144 and ferroelectric capacitor 126/136/146.

As shown in FIG. 1, the gate terminal 122g of the write transistor 122 is connected to the first write word line WLw1. A first terminal of the write transistor 122 is connected to a second write bit line BLw2. A first terminal of the read transistor 124 is connected to a second read bit line BLr2. A first electrode 116a of the ferroelectric capacitor 126 is connected to the first control line CL1.

The gate terminal 132g of the write transistor 132 is connected to a second write word line WLw2. A first terminal 132a of the write transistor 132 is connected to the first write bit line BLw1. A first terminal 134a of the read transistor 134 is connected to the first read bit line BLr1. A first electrode 136a of the ferroelectric capacitor 136 is connected to a second control line CL2.

The gate terminal 142g of the write transistor 142 is connected to the second write word line WLw2. A first terminal of the write transistor 142 is connected to the second write bit line BLw2. A first terminal of the read transistor 144 is connected to the second read bit line BLr2.

A first electrode 146a of the ferroelectric capacitor 146 is connected to the second control line CL2.

The memory device 100 comprises driver circuitry 200. The driver circuitry 200 includes wordline drivers 201, 202 for applying write control voltages to the write wordlines WLw1, WLw2, respectively. The driver circuitry includes write bit line drivers 221, 222 for applying write data and erase data voltages to the write bit lines BLw1, BLw2, respectively. The driver circuitry includes control line drivers 211, 212 for applying control voltages to the control lines CL1, CL2, respectively. The driver circuitry includes read bit line drivers 231, 232 for applying read bit voltages to the read bit lines BLr1, BLr2, respectively.

The memory device 100 may further comprise read-out circuitry in the form of sense amplifier circuitry including sense amplifiers 241, 242. The sense amplifier 241 is connected along the read-out path of the read transistors 114, 134. The sense amplifier 242 is connected along the read-out path of the read transistors and 124, 144. The sense amplifier circuitry may be configured to perform read-out by current sensing. As will be further disclosed below, a constant voltage may be applied to bit cells which are to be read wherein the sense amplifier circuitry may sense the resulting read current in DC.

A method for operating the memory device 100, including writing and reading bit cells, will now be described with further reference to FIG. 2, according to embodiments. The writing and reading operations will be described with reference to the bit cell 110 but writing and reading operations may be applied to also the other bit cells 120, 130, 140 in a corresponding manner.

In the following, it will be assumed that a first polarization state of the ferroelectric capacitor 116 is such that, in response to a low-level voltage reference such as a zero voltage being applied to the first control line CL1, a resulting voltage at the gate terminal 114g of the read transistor 114 meets or exceeds a threshold voltage of the read transistor 114. Conversely, an opposite second polarization state of the ferroelectric capacitor 116 is such that, in response to a low-level voltage reference such as a zero voltage being applied to the first control line CL1, a resulting voltage at the gate terminal 114g of the read transistor 114 is smaller than a threshold voltage of the read transistor 114.

The driver circuitry 200 may, as shown in the first row of the table in FIG. 2, write data (e.g., a logical "1") to the bit cell 110. The driver circuitry 200 may apply a voltage Vcc (representing a predetermined high-level voltage which is above a threshold voltage of the write transistor 112) to the write word line WLw1, thereby switching the write transistor 112 to an on state. While the write transistor 112 is in the on state, a bias is applied across the ferroelectric capacitor 116 by applying a first voltage to the first electrode 116a of the ferroelectric capacitor 116 via the first control line CL1 and a second voltage to the second electrode 116b of the ferroelectric capacitor 116 via the write bit line BLw1. The second voltage may as shown in FIG. 2 also be a high-level voltage Vcc. The first voltage may be a zero voltage. In any case, the first and the second voltages should be such that the ferroelectric capacitor 116 assumes the first polarization state. The write transistor 112 may thereafter be switched off and the write bit line BLw1 may be returned to a zero voltage. Due to the remnant polarization of the ferroelectric layer of the ferroelectric capacitor 116, a write data polarization state has been stored.

The driver circuitry 200 may, as shown in the second row of the table in FIG. 2, erase data (in effect initializing the bit cell 110 or writing a "0" to the bit cell 110). The driver circuitry 200 may apply a voltage Vcc to the write word line WLw1, thereby switching the write transistor 112 to an on state. While the write transistor 112 is in the on state, a bias is applied across the ferroelectric capacitor 116 by applying a third voltage to the first electrode 116a of the ferroelectric capacitor 116 via the first control line CL1 and a fourth voltage to the second electrode 116b of the ferroelectric capacitor 116 via the write bit line BLw1. The third voltage may as shown in FIG. 2 be a high-level voltage Vcc. The fourth voltage may be a zero voltage. In any case, the third and the fourth voltages should be such that the ferroelectric capacitor 116 assumes the opposite second polarization state. The write transistor 112 may thereafter be switched off and the control line CL1 may be returned to a zero voltage. Due to the remnant polarization of the ferroelectric layer of the ferroelectric capacitor 116, an erase data polarization state has been stored.

The driver circuitry 200 may, as shown in the third row of the table in FIG. 2, read data. The driver circuitry 200 may keep the write transistor 112 in the off state during reading (e.g., by applying a zero voltage to the write word line WLw1). A read bit voltage (e.g., the high-level voltage Vcc or other non-zero voltage) may be applied to the first terminal 112a of the read transistor 114 via the read bit line BLr1. A fifth voltage may be applied to the first electrode 116a of the ferroelectric capacitor 116 via the control line CL1. The fifth voltage is chosen such that:

on a condition that the write data polarization state is stored in the ferroelectric capacitor 116 when the fifth voltage is applied to the first electrode 116a, the read transistor 114 is switched to an on state, whereas on a condition that the erase data polarization state is stored in the ferroelectric capacitor 116 when the fifth voltage is applied to the first electrode 116a, the read transistor 114 remains in an off state.

The fifth voltage may, as indicated in FIG. 2, for instance, be a zero voltage.

During the reading operation, a bias may be applied between the first and second terminals 114a, 114b of the read transistor, for instance as indicated in the BLr1 and SL1/GND columns of FIG. 2, where VCC and SA refers to a high-level voltage applied during read out, depending on, e.g., whether the second terminal 114b of the read transistor is connected to ground or a sense amplifier.

During reading data from the bit cell 110, reading from the additional bit cell 130 may be inhibited by applying a sixth voltage to the first electrode 136a of the ferroelectric capacitor 136 via the second control line CL2. The sixth voltage may as shown be a negative voltage of such a magnitude that the voltage at the gate terminal 134g of the read transistor 134 is pulled-down to a level below the threshold voltage of the read transistor 134, for instance −VCC/2.

FIG. 3 illustrates an alternative method for operating the memory device 100, including writing and reading bit cells, according to some other embodiments.

In the following, it will be assumed that the first polarization state of the ferroelectric capacitor 116 is such that, in response to a low-level voltage reference such as a zero voltage being applied to the first control line CL1, a resulting voltage at the gate terminal 114g of the read transistor 114, is smaller than a threshold voltage of the read transistor 114. Moreover, the opposite second polarization state of the ferroelectric capacitor 116 is such that, in response to a low-level voltage reference such as a zero voltage being applied to the first control line CL1, a resulting voltage at the gate terminal 114g of the read transistor 114 is smaller than a threshold voltage of the read transistor 114. More specifically, the first polarization state is such that a positive voltage needs to be applied to the first control line CL1 in order to shift the voltage at the gate terminal 114g of the read transistor 114 above the threshold voltage of the read transistor 114.

Hence, as shown in FIG. 3, data may be written and erased in a manner corresponding to that discussed in connection with FIG. 2. However, during read, a positive non-zero voltage such as VCC/2 is applied to the first control line CL1. In case the first polarization state is stored in the ferroelectric capacitor 116, the resulting voltage at the gate terminal 114g of the read transistor 114 meets or exceeds the threshold voltage of the read transistor 114. However, in case the second polarization state is stored in the ferroelectric capacitor 116, the resulting voltage at the gate terminal 114g of the read transistor 114 is less than the threshold voltage of the read transistor 114.

During reading data from the bit cell 110 reading from the additional bit cell 130 may be inhibited by applying a sixth voltage to the first electrode 136a of the ferroelectric capacitor 136 via the second control line CL2. The sixth voltage may be a low-level voltage of such a magnitude that the voltage at the gate terminal 134g of the read transistor 134 remains below the threshold voltage of the read transistor 134, regardless of whether the first or the second polarization state is stored in the ferroelectric capacitor 116. The sixth voltage may, as shown in FIG. 3, be a zero voltage.

Figure 4:
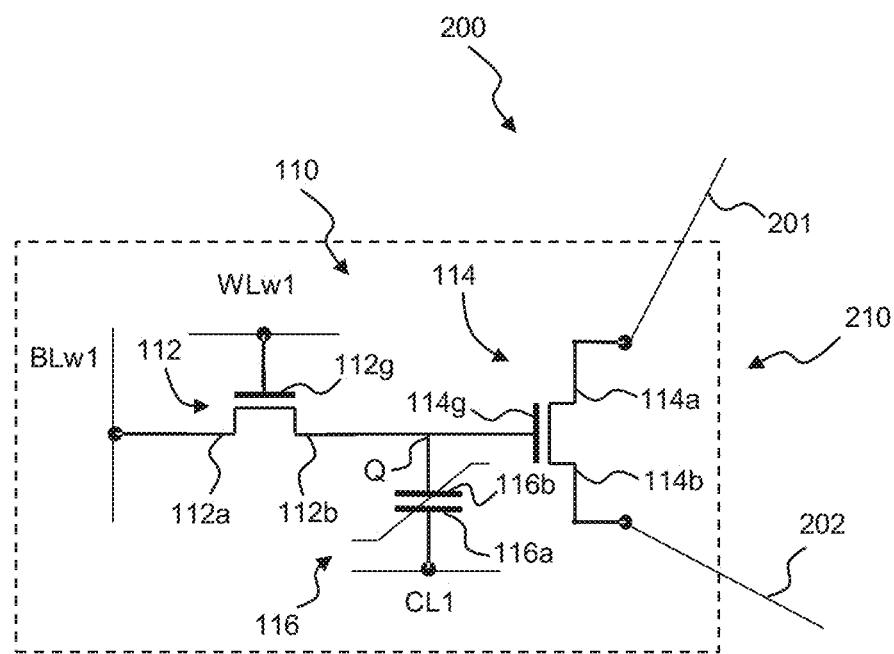
FIG. 4 is a schematic illustration of an field programmable gate array (FPGA) according to embodiments.

FIG. 4 illustrates a field programmable gate array (FPGA) device 200. The FPGA device 200 includes an interconnect circuitry including a system of signal routing lines and a plurality of programmable interconnect points. FIG. 4 schematically shows a portion of the FPGA device 200 at an interconnection point 210 between a pair 201, 202 of signal routing lines. It may be understood that the device 200 may include a large grid of signal routing lines with a plurality of correspondingly configured interconnect points. The FPGA device 200 further includes the memory device 100, which in FIG. 4 is represented by the bit cell 110. The read transistor 114 of the bit cell 110 is arranged at the programmable interconnect points 210 and is configured to selectively interconnect the pair 201, 202 of signal routing lines. The first terminal 114a of the read transistor 114 is connected to the routing line 201. The second terminal 114b is connected to the routing line 202. The lines 201, 202 may hence be programmed to be interconnected to each other by storing the first polarization state in the ferroelectric capacitor 116. Conversely, the lines 201, 202 may be programmed to be disconnected from each other by storing the second polarization state in the ferroelectric capacitor 116. The interconnection/disconnection may be activated during read out of the bit cell 110, by applying appropriate voltages to the first control line CL1 and the bit line read BLr1, as disclosed above.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A memory device comprising:
    a bit cell comprising:
        a write transistor, a read transistor and a ferroelectric capacitor;
        a write word line connected to a gate terminal of the write transistor;
        a write bit line connected to a first terminal of the write transistor;
        a read bit line connected to a terminal of the read transistor, wherein the read bit line and the write bit line are separate from each other and are independently accessible by a driver circuitry;
        a first control line connected to a first electrode of the ferroelectric capacitor,
        wherein a second terminal of the write transistor is connected to a gate terminal of the read transistor, and
        wherein a second electrode of the ferroelectric capacitor is connected to the second terminal of the write transistor and to the gate terminal of the read transistor;
    an additional bit cell comprising:
        a second write transistor;
        a second read transistor having a terminal connected to the read bit line; and
        a second ferroelectric capacitor having a first electrode connected to a second control line and a second electrode connected to a gate terminal of the second read transistor,
        wherein the driver circuitry is configured such that during reading data from the bit cell, a common positive read bit voltage is applied to the terminal of the first read transistor and the terminal of the second read transistor through the read bit line, wherein a first voltage is applied to the first electrode of the ferroelectric capacitor via the first control line, wherein a second voltage is applied to the first electrode of the second ferroelectric capacitor via the second control line, and wherein the second voltage has a value that is about one half of a magnitude of the common positive read bit voltage subtracted from the first voltage, such that the additional bit cell is inhibited from being read.

2. The memory device according to claim 1, wherein the read transistor further comprises a second terminal connected to a sense line of the memory device.

3. The memory device according to claim 1, wherein the read transistor further comprises a second terminal connected to a voltage reference.

4. The memory device according to claim 1, wherein the driver circuitry is configured to write data to the bit cell by:
    switching the write transistor to an on state by applying a write control voltage to the write transistor via the write word line, and
    setting a polarization of a ferroelectric layer of the ferroelectric capacitor to a first polarization state by applying a first voltage to the first electrode of the ferroelectric capacitor via the first control line and a second voltage to the second electrode of the ferroelectric capacitor via the write bit line, wherein the second voltage is greater than the first voltage.

5. The memory device according to claim 4, wherein the driver circuitry is configured to erase data from the bit cell by:
    switching the write transistor to an on state by applying an erase control voltage to the write transistor via the write word line, and
    setting the polarization of the ferroelectric layer to a second polarization state by applying a third voltage to the first electrode of the ferroelectric capacitor via the first control line and a fourth voltage to the second electrode of the ferroelectric capacitor via the write bit line, wherein the third voltage is greater than the fourth voltage.

6. The memory device according to claim 1, wherein the driver circuitry is configured to read data from the bit cell by:
applying the common positive read bit voltage to the terminal of the read transistor via the read bit line, applying the first voltage to the first electrode of the ferroelectric capacitor via the first control line, wherein the first voltage is such that:
on a condition that a ferroelectric layer of the ferroelectric capacitor is in a first polarization state when the first voltage is applied to the first electrode, the read transistor is switched to an on state, and
on a condition that the ferroelectric layer is in a second polarization state when the first voltage is applied to the first electrode, the read transistor remains in an off state.

7. The memory device according to claim 6, wherein the first polarization state is such that a voltage at the gate terminal of the read transistor, in response to a voltage reference applied to the first control line, is at or exceeds a threshold voltage of the read transistor, and wherein the second polarization state is such that the voltage at the gate terminal of the read transistor, in response to the voltage reference applied to the first control line, is smaller than the threshold voltage of the read transistor.

8. The memory device according to claim 7,
wherein the first voltage applied by the driver circuitry to the first control line during reading data from the bit cell is a zero voltage, and
wherein the driver circuitry is configured to, during reading data from the bit cell, inhibit reading from the additional bit cell by:
applying the second voltage to the first electrode of the ferroelectric capacitor via the second control line, wherein the second voltage is a negative voltage such that, when the first voltage is applied to the first electrode, the read transistor remains in an off state regardless of the whether the ferroelectric capacitor is in the first polarization state or the second polarization state.

9. The memory device according to claim 6, wherein each of the first polarization state and the second polarization state is such that a voltage at the gate terminal of the read transistor, in response to a voltage reference being applied to the first control line, is less than a threshold voltage of the read transistor.

10. The memory device according to claim 9,
wherein the first voltage applied by the driver circuitry to the first control line during reading data from the bit cell is a positive voltage, and
wherein the driver circuitry is configured to, during reading data from the bit cell, inhibit reading from the additional bit cell by:

applying the second voltage to the first electrode of the second ferroelectric capacitor via the second control line, wherein the second voltage is a positive voltage smaller than the first voltage.

11. The memory device according to claim 4, wherein the first voltage is a first predetermined voltage and the second voltage is a second predetermined voltage lower than the first predetermined voltage.

12. The memory device according to claim 5, wherein the third voltage is a first predetermined voltage, and wherein the fourth voltage is a second predetermined voltage higher than the third voltage.

13. A field programmable gate array (FPGA) device, comprising:
an interconnect circuitry including a system of signal routing lines and a plurality of programmable interconnect points; and
a memory device according to claim 1, wherein the read transistor of the bit cell is arranged at one of the programmable interconnect points and is configured to selectively interconnect a pair of the signal routing lines.

14. A method for operating a memory device, the method comprising:
providing the memory device according to claim 1;
switching the write transistor to an on state by applying a write control voltage to the write transistor via the write word line; and
setting a polarization of a ferroelectric layer of the ferroelectric capacitor to a first polarization state by applying the first voltage to the first electrode of the ferroelectric capacitor via the first control line and the second voltage to the second electrode of the ferroelectric capacitor via the write bit line, wherein the second voltage is greater than the first voltage.

15. The method according to claim 14, further comprising:
switching the write transistor to an on state by applying an erase control voltage to the write transistor via the write word line; and
setting the polarization of the ferroelectric layer to a second polarization state by applying a third voltage to the first electrode of the ferroelectric capacitor via the first control line and a fourth voltage to the second electrode of the ferroelectric capacitor via the write bit line, wherein the third voltage is greater than the fourth voltage.

16. The method according to claim 1, wherein the common positive read bit voltage is a positive voltage (Vcc) above a threshold voltage of the write transistor.

17. The method according to claim 16, wherein the first voltage is about zero and the second voltage is about −Vcc/2.

18. The method according to claim 16, wherein the first voltage is about Vcc/2 and the second voltage is about zero.

* * * * *

UNITED STATES PATENT AND TRADEMARK OFFICE
CERTIFICATE OF CORRECTION

PATENT NO. : 11,211,108 B2
APPLICATION NO. : 16/226356
DATED : December 28, 2021
INVENTOR(S) : Jan Van Houdt Page 1 of 1

It is certified that error appears in the above-identified patent and that said Letters Patent is hereby corrected as shown below:

In the Claims

In Column 14, Line 48 (Approx.), delete "method" and insert --memory device--.

In Column 14, Line 54, delete "method" and insert --memory device--.

Signed and Sealed this
Ninth Day of August, 2022

Katherine Kelly Vidal
*Director of the United States Patent and Trademark Office*